United States Patent
Nguyen

(10) Patent No.: US 11,018,411 B2
(45) Date of Patent: **\*May 25, 2021**

(54) RF ANTENNA ARRANGEMENT CONFIGURED TO BE A PART OF A LID TO AN APPARATUS

(71) Applicant: DISH Technologies L.L.C., Englewood, CO (US)

(72) Inventor: Phuc H. Nguyen, Parker, CO (US)

(73) Assignee: DISH TECHNOLOGIES L.L.C., Englewood, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/745,961

(22) Filed: Jan. 17, 2020

(65) Prior Publication Data
US 2020/0153085 A1 May 14, 2020

Related U.S. Application Data

(63) Continuation of application No. 15/331,494, filed on Oct. 21, 2016, now Pat. No. 10,581,141.

(51) Int. Cl.
*H01Q 1/22* (2006.01)
*H01Q 1/24* (2006.01)
(Continued)

(52) U.S. Cl.
CPC ............... *H01Q 1/24* (2013.01); *H01Q 1/22* (2013.01); *H01Q 1/2283* (2013.01); *H01Q 1/38* (2013.01);
(Continued)

(58) Field of Classification Search
CPC .......... H01Q 1/22; H01Q 1/2283; H01Q 1/44; H01Q 1/52; H05K 9/0022; H05K 9/0026
See application file for complete search history.

(56) References Cited

U.S. PATENT DOCUMENTS 6,342,860 B1  1/2002  Haussler et al.
6,417,817 B1  7/2002  Pirilä et al.
(Continued)

FOREIGN PATENT DOCUMENTS

CN        201156582 Y    11/2008
DE   20 2006 020 103 U1  11/2002

OTHER PUBLICATIONS

International Search Report and Written Opinion, dated Feb. 2, 2018, for International Application No. PCT/US2017/057618, 10 pages.

(Continued)

*Primary Examiner* — Hasan Z Islam
(74) *Attorney, Agent, or Firm* — Seed IP Law Group LLP

(57) ABSTRACT

An RF antenna arrangement has the same or slightly larger footprint as the RF shield for radio chips on a printed circuit board. The apparatus includes a printed circuit board, a digital processor, a radio chip(s), a radio frequency shield, a lid, and an RF antenna arrangement(s). The lid has the same or slightly larger footprint as the RF shield, which enables the lid to fit on the RF shield. The RF antenna is formed as an integral part of the lid. The apparatus also includes an RF transmission coaxial cable(s) having a first end physically and electrically connected to the RF antenna arrangement(s) and the surface of the lid, and a second end electrically coupled to an RF connector. By forming the antenna arrangement(s) from the lid, this invention solves the space constraint problems of antenna placements for wireless device applications. Additionally, this invention is cost-effective and simple to manufacture.

11 Claims, 7 Drawing Sheets

(51) Int. Cl.
   *H01Q 5/371*   (2015.01)
   *H01Q 1/52*    (2006.01)
   *H05K 9/00*    (2006.01)
   *H01Q 1/44*    (2006.01)
   *H01Q 1/38*    (2006.01)
   *H01Q 1/48*    (2006.01)

(52) U.S. Cl.
   CPC ................ *H01Q 1/44* (2013.01); *H01Q 1/48* (2013.01); *H01Q 1/526* (2013.01); *H01Q 5/371* (2015.01); *H05K 9/0026* (2013.01)

(56) References Cited

U.S. PATENT DOCUMENTS

| | | |
|---|---|---|
| 6,539,207 B1 | 3/2003 | del Castillo et al. |
| 6,580,395 B2 | 6/2003 | Koshizaka et al. |
| 7,079,079 B2 | 7/2006 | Jo et al. |
| 9,070,070 B2 | 6/2015 | Nguyen |
| 10,170,838 B2 | 1/2019 | Garcia et al. |
| 2004/0032371 A1* | 2/2004 | Mendolia ............ H01Q 15/006 343/702 |
| 2004/0119654 A1 | 6/2004 | Koyama |
| 2004/0252064 A1 | 12/2004 | Yuanzhu |
| 2005/0190109 A1 | 9/2005 | Washiro |
| 2006/0097949 A1 | 5/2006 | Luebke et al. |
| 2007/0229374 A1 | 10/2007 | Shimura |
| 2008/0180339 A1 | 7/2008 | Yagi |
| 2012/0274517 A1 | 11/2012 | Nagoshi et al. |
| 2013/0088404 A1 | 4/2013 | Ramachandran et al. |
| 2013/0120215 A1 | 5/2013 | Shih et al. |
| 2014/0300518 A1 | 10/2014 | Ramachandran et al. |
| 2015/0357718 A1 | 12/2015 | Singh et al. |
| 2017/0317419 A1 | 11/2017 | Wu et al. |
| 2017/0324146 A1 | 11/2017 | Karlsson |
| 2018/0115051 A1 | 4/2018 | Nguyen |
| 2018/0316081 A1 | 11/2018 | Nguyen |
| 2019/0252761 A1 | 8/2019 | Nguyen |

OTHER PUBLICATIONS

International Search Report and Written Opinion, dated Jul. 6, 2018, for International Application No. PCT/US2018/029943, 13 pages.

\* cited by examiner

RF ANTENNA ARRANGEMENT CONFIGURED TO BE A PART OF A LID TO AN APPARATUS

BACKGROUND

Technical Field

Embodiments of the subject matter described herein relate generally to radio frequency (RF) devices and RF communication. More particularly, embodiments of the subject matter relate to a transceiver board, which includes an RF antenna arrangement configured to be a part of a lid.

Description of the Related Art

The prior art is replete with systems, devices, and components that support wireless data communication in one form or another. For example, most (if not all) portable computer-based devices (laptop computers, tablet computers, smartphones, and video game platforms) support wireless communication in accordance with the Wi-Fi communication protocol, the Bluetooth communication protocol, cellular communication protocols, and the like. Moreover, many consumer products and appliances are also being offered with native wireless data communication capabilities. For example, television equipment, DVD players, audio equipment, and video services receivers (set top boxes) may be provided with native Wi-Fi and/or Bluetooth communication features. Each of these wireless devices may transmit at different frequencies and using a different protocol. It is beneficial to have an antenna system that is able to operate at many different frequencies and fit in a small space. Such wireless data communication requires data transmission in accordance with a specific data communication protocol, a radio frequency (RF) transceiver, and a suitable antenna structure configured to transmit and receive signals.

It can be challenging to design and implement an efficient antenna assembly that will operate for all the expected frequencies. In some instances, many antennas might be used, but each antenna takes up space. It may be difficult to deploy and position an RF antenna assembly in compact form for different applications where space is limited or otherwise restricted.

Accordingly, it is desirable to have a compact, efficient, and effective RF antenna structure that can receive many different frequencies that is suitable for use with host device, such as a video services receiver, an appliance, or the like. Furthermore, other desirable features and characteristics of the present invention will become apparent from the subsequent detailed description and the appended claims, taken in conjunction with the accompanying drawings and the foregoing technical field and background.

BRIEF SUMMARY

An exemplary embodiment of an apparatus includes a printed circuit board, a chip, a radio frequency shield, a lid and an RF antenna arrangement. The RF antenna arrangement is configured to be a part of the lid. The apparatus also includes an RF transmission cable having a first end physically and electrically connected to the RF antenna arrangement and the surface of the lid, and having a second end electrically coupled to a RF connector.

Another exemplary embodiment of an apparatus is provided here. The apparatus includes a printed circuit board, a digital processor, a plurality of chips, a radio frequency shield, a lid, and a plurality of RF antenna arrangements. The lid has the same footprint as the radio frequency shield, which enable the lid to fit the radio frequency shield. The apparatus also includes an RF transmission cable having a first end physically and electrically connected to the RF antenna arrangement and the surface of the lid, and having a second end electrically coupled to a RF connector.

By forming the antenna arrangement from the lid, this invention solves the space constraint problems of antenna placements for wireless device applications. Additionally, this invention is cost-effective and simple to manufacture.

BRIEF DESCRIPTION OF THE SEVERAL VIEWS OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with a set-top box, a mother board or a transceiver board have not been shown or described in detail to avoid unnecessarily obscuring descriptions of the embodiments.

Figure 1:
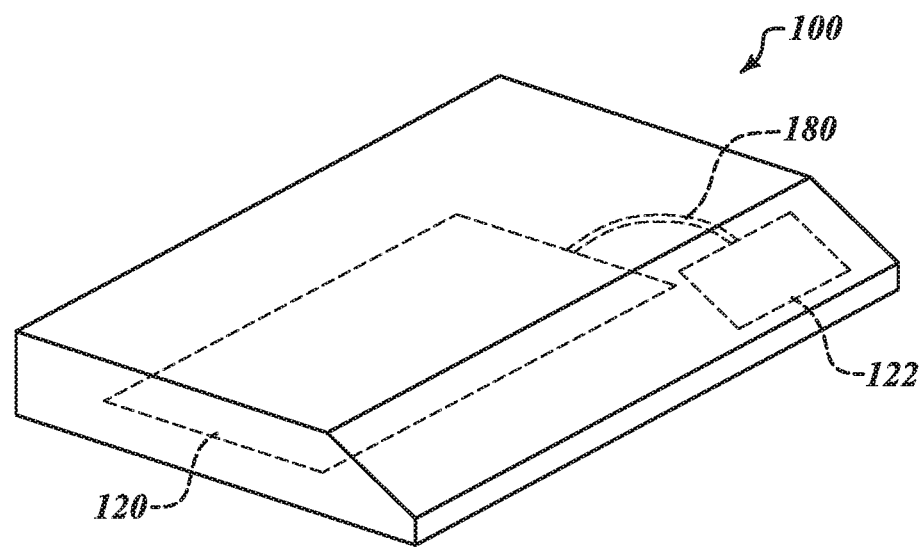
FIG. 1 is a front isometric view of a set-top box including a transceiver board with an antenna assembly according to one embodiment of the present disclosure.

In FIG. 1, a set-top box 100 is shown. In the set-top box 100, a mother board 120 and a transceiver board 122 are installed. An input/output (e.g. USB) cable 180 connects the mother board 120 with the transceiver board 122. It should be understood that the set-top box 100 will include additional components, features, devices, hardware, DVD player, hard drive to store video data, software, and processing logic that cooperate to provide the desired video services functionality. Thus, although not shown in FIG. 1, the set-top box 100 may also include, without limitation: one or more printed circuit boards, power supply or power regulation components, electronic components and devices, memory elements, a hard disk, one or more processor chips, and the like. These and other conventional aspects of the set-top box 100 will not be described in detail here. The RF transmission cable 124 has an appropriate length that allows it to span the distance between the transceiver board 122 and the mother board 120.

Figure 2:
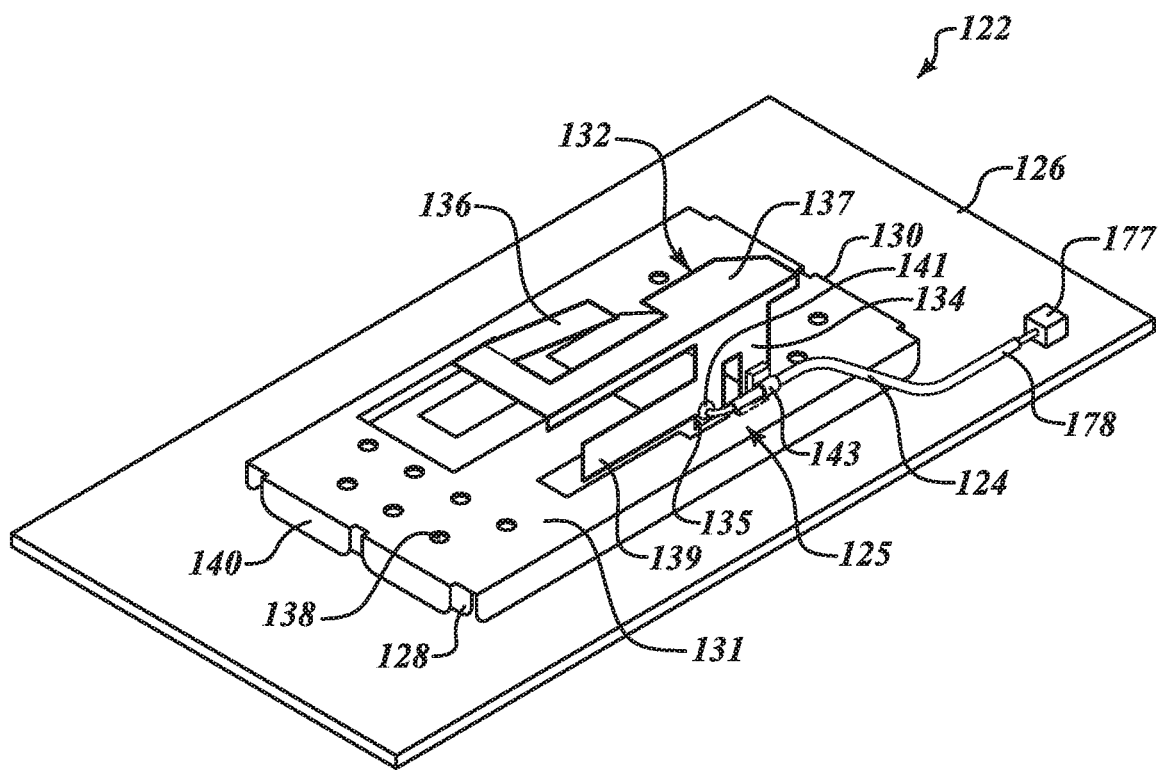
FIG. 2 is an isometric view of the antenna assembly on the transceiver board according to one embodiment of the present disclosure.

In FIG. 2, the details of the transceiver board 122 are shown. The transceiver board 122 comprises a printed circuit board 126, a radio frequency shield 128 and a lid 130. The lid 130 might include several holes 138 to permit cooling airflow, insert tabs 140 and a RF antenna arrangement 132, which includes of a first section (e.g. grounded terminal element) 134, a second section (e.g. antenna feed) 135, a third section (e.g., 2.4 GHz band antenna element) 136, a fourth section (e.g. resonating element for both 2.4/5 GHz bands) 137 and a fifth section (e.g. 5 GHz band antenna element) 139. The RF transmission cable 124 has two terminals, a signal terminal 141 that is soldered directly to the second section 135 of the RF antenna arrangement 132 and a ground terminal 143 that is soldered directly to the surface 131 of the lid 130.

The transceiver board 122 supports wireless data communication functions of the set-top box 100. The transceiver board 122 is configured to receive, transmit, and process data in accordance with one or more wireless communication protocols and frequencies. In this regard, the RF antenna arrangement 132 may be compatible with one or more of the following wireless data communication protocols, without limitation: IEEE 802.11 (any variant), also known as Wi-Fi; the Bluetooth wireless protocol; and IEEE 802.15, also known as ZigBee. Consequently, the transceiver board 122 supports RF signals having frequencies in the bands that are specified by these wireless communication protocols. In certain embodiments, therefore, the RF antenna arrangement 132 can handle signals in the 2.4 GHz band, the 5.0 GHz band, or dual bands (with the corresponding frequency channels) as specified by the IEEE 802.11, IEEE 802.15, and Bluetooth specifications. In this regard, the RF antenna arrangement 132 is designed, fabricated, and tuned for operation at the desired frequency bands and channels. The antenna arrangement 132 can be any acceptable antenna that can receive one or more of these frequencies. In FIGS. 2-5, a type of inverted F antenna is shown, while in FIGS. 6A-8, the antenna shown is a dipole 5 GHz antenna. The inverted F, H, inverted H, MIFA, inverted L, folded inverted L, double L, comb, and others are well known styles of antenna shapes for these types of applications and any antenna that works with the various wireless protocols is acceptable.

The transceiver board 122 supports wireless data communication functions of the set-top box 100, such as short-range peer-to-peer wireless communication, wireless local area network communication, Internet connectivity, or the like. The data received/transmitted by the transceiver board 122 can be routed by, processed by, or otherwise handled by one or more other components, processing modules, or devices of the set-top box 100.

The RF transmission cable 124 (which may be realized as an RF coaxial cable in some embodiments) has a first end 125 with two terminals, a signal terminal 141 and a ground terminal 143. A second end 178 of the RF transmission cable 124 may include a compatible connector that is configured to mate with an RF connector 177 on the transceiver board 122, as shown in FIG. 2. Alternatively, the first end 125 may be otherwise designed to mate with the RF antenna arrangement 132 by way of a solder connection, a press-fit coupling, or the like. As one non-limiting example, the RF connector may be a miniature coaxial connector such as a "Hirose U.FL" connector, sometimes also referred to as ufl connector. A similar type of connection could be utilized to physically and electrically couple the RF transmission cable 124 to the transceiver board 122.

Figure 3A:
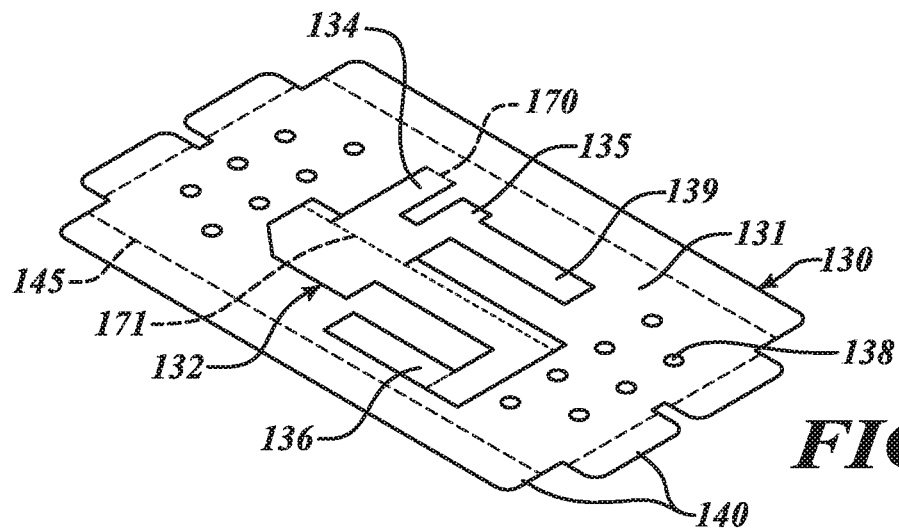
FIGS. 3A-3C are top isometric views of the process of forming the RF antenna assembly according to one embodiment of the present disclosure.
Figure 3B:
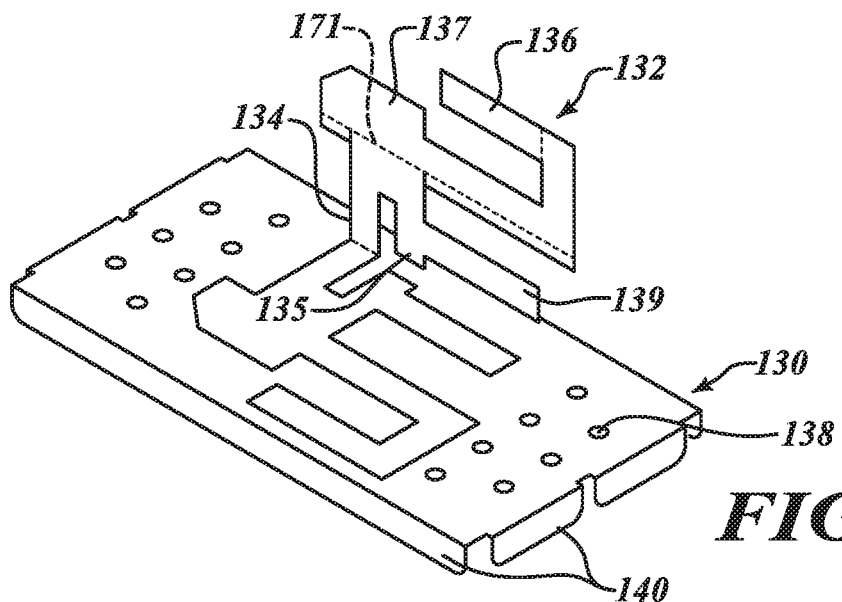
Figure 3C:
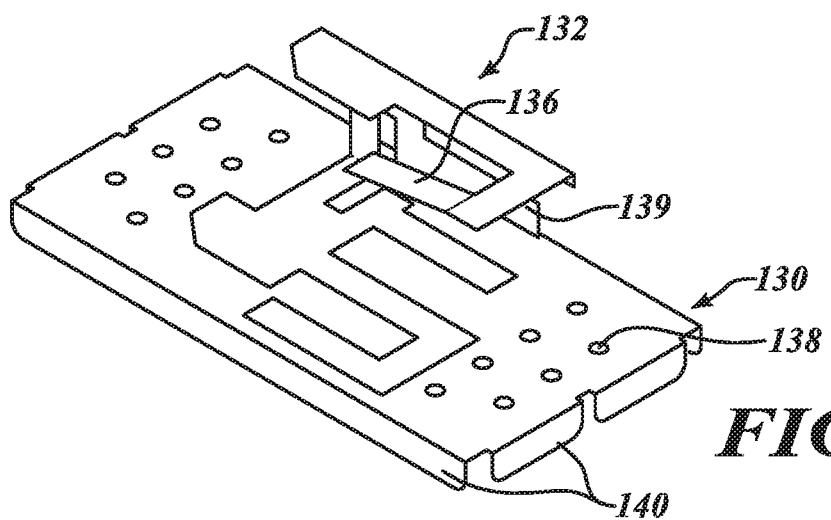

Referring now to FIGS. 3A, 3B and 3C, the processes of forming the antenna arrangement 132 are shown. The lid 130 starts as a flat sheet. It is usually in the form of a large flat sheet from which several, even several hundred antennas can be stamped in a single press. The large flat sheet is stamped to form a single flat sheet antenna, as shown in FIG. 3A. Each antennas lid 130 is also stamped out to permit forming of each of the antenna arrangement sections, such as the first section 134, the second section 135, etc., the several holes 138 and the insert tabs 140, as shown in FIG. 3A. Dotted lines 145, 170 and 171 show where the sheet is to be later bent to form the antenna structure. The first section 134 can be bent to extend vertically from the surface 131 of the lid 130 along the dotted line 170 and the tabs 140 can be bent to extend vertically from the surface 131 of the lid 130 along the dotted lines 145 in a vertical direction opposite of the first section 134 as shown in FIG. 3B. The third section 136 and fourth section 137 are bent to extend horizontal and thus parallel with the surface 131 of the lid 130 along the dotted line 171, as shown in FIG. 3C. The third section 136 and the fourth section 137 are thus perpendicular to the first section 134 and the second section 135. In some embodiments, the third section 136 is bent at a downward angle towards the lid 130, such as at a 10 degree angle.

As best seen in FIG. 3B, the second section 135 is physically separate from the lid surface 131. The open space between the lid surface 131 and the second section 135 permits that section to be a preferred location for the antenna signal to be picked up on the signal terminal 141 of the RF transmission cable 124, as illustrated in FIG. 2. The lid 130 is formed from an electrically conductive material such as, without limitation, stainless steel, copper, aluminum, alloys thereof, or the like. As is well-understood by those familiar with RF antenna design, the RF antenna arrangement 132 is tuned primarily by adjusting or selecting its length, i.e., the length of its major longitudinal path. A longer path of the third section 136 results in a lower resonant frequency, and a shorter path of the fifth section 139 results in a higher resonant frequency. The first section 134 extends vertically to a selected height to create an appropriate distance that allows the second, third, fourth and other sections to function as an antenna. Of course, the second section 135 can have a contact with the first end 125 of the RF transmission cable 124 by way any known connection, such as a solder connection, a press-fit coupling, or the like. The other sections 135, 136, etc. work as an antenna and may be compatible with one or more of the following wireless data communication protocols, without limitation: IEEE 802.11 (any variant), also known as Wi-Fi; the Bluetooth wireless protocol; and IEEE 802.15, also known as ZigBee.

Figure 4:
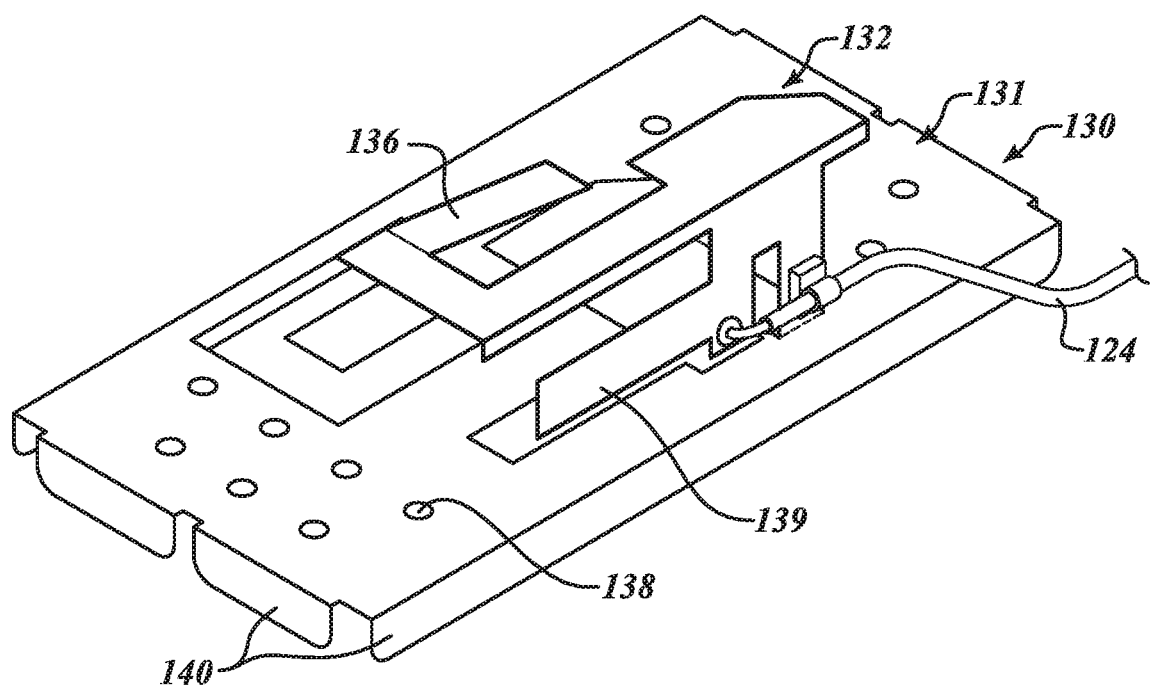
FIG. 4 is an isometric view of the RF antenna assembly according to one embodiment of the present disclosure.

In FIG. 4, the lid 130 is shown having the flat surface 131, final antenna arrangement 132, the tabs 140 and other structures as described herein. The RF transmission cable 124 is electrically connected, such as by being soldered to the RF antenna arrangement 132 and grounded to the surface 131 of the lid 130.

Figure 5:
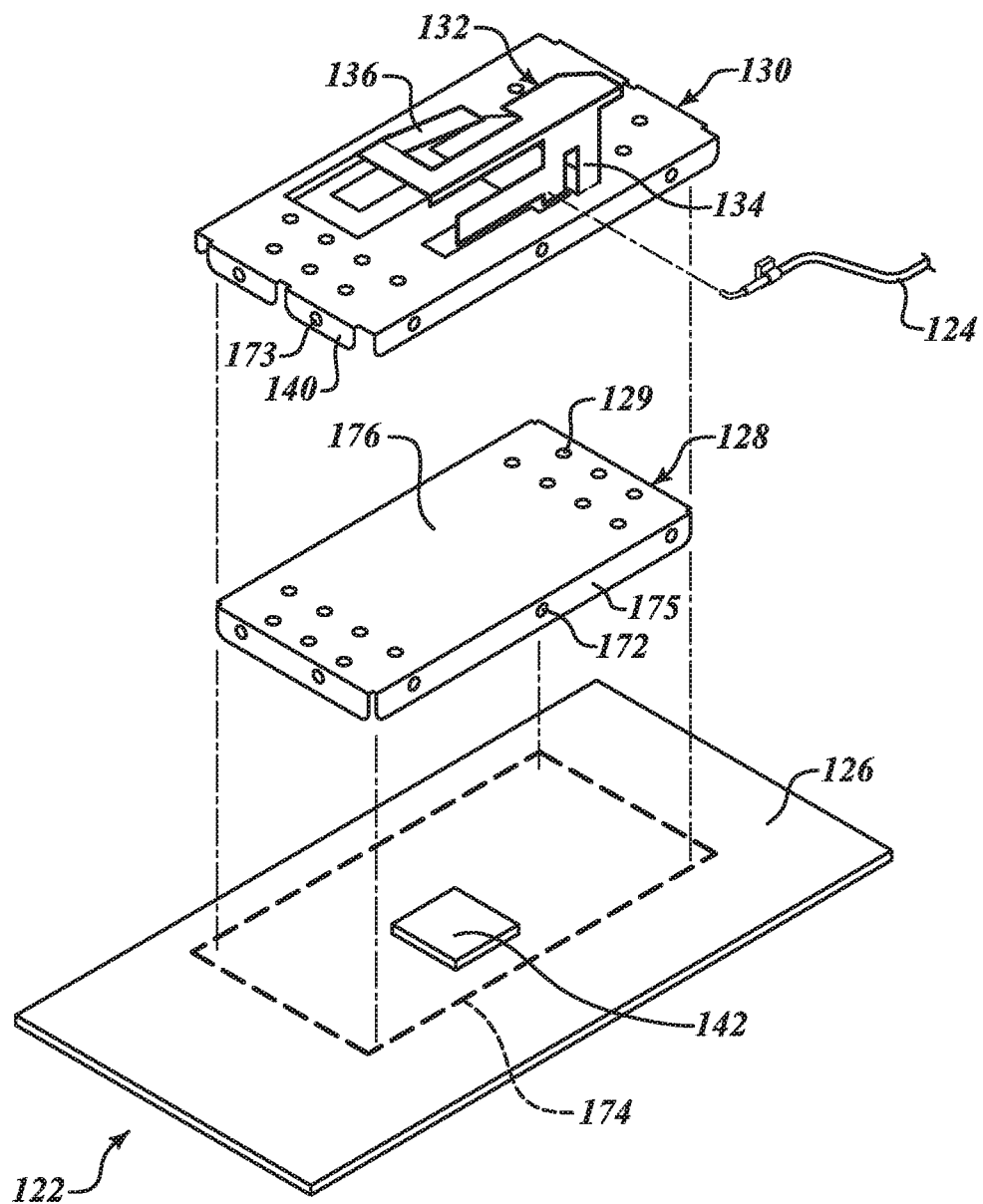
FIG. 5 is an exploded view of the shield, antenna assembly and transceiver board according to one embodiment of the present disclosure.

In FIG. 5, an exploded view of the transceiver board 122 assembly is shown. An RF chip 142 is mounted on the printed circuit board 126. The RF chip 142 is an integrated circuit, semiconductor chip that is mounted on the printed circuit board. This chip 142 has radio frequency communication circuits formed thereon. The circuits in the chip 142 are of the type that can process a Bluetooth signal, Wi-Fi, Zigbee or other type of RF signal. A radio frequency shield 128 is mounted on the printed circuit board 126 to overlay and encase the chip 142. Since the chip 142 must process specific RF signals, it is preferred to shield it from other types of electromagnetic waves, RF interference, and other noise. For example, electromagnetic waves of the type that might be emitted by a LTE cell phone, USB 2.0/3.0, DDR SDRAM or other types of electromagnetic radiation. The shield 128 includes a surface 176 that in some embodiments, is a solid piece of metal, while in other embodiments it might have holes 129 to permit heat transfer, while in other embodiments it may have large apertures. The shield 128 also includes flaps 175 that are folded from the surface 176 to be perpendicular to the surface 176, similar to the tabs 140 on the lid 130.

The shield 128 may be physically connected to the printed circuit board 126 via a solder paste region illustrated by dotted lines 174. The solder paste region 174 may be arranged to permit the flaps 175 of the shield 128 to contact and connect to the printed circuit board 126.

The shield 128 is grounded to block all stray radio wave signals from the chip 142. The ground connection of the lid 130, which forms the ground of antenna arrangement 132 is physically and electrical connected to the shield 128. The two metal sheets for the shield 128 and the lid 130 directly abut each other and thus form a solid physical and electrical connection. These are also connected to the ground of the printed circuit board 126.

The lid 130 overlays directly on the radio frequency shield 128. This arrangement permits the combination of the chip 142, the shield 128 and the antenna arrangement 132 to share a common area and have the same footprint. Space is often limited in the front section of the set top box 100. The embodiments as described herein permit the same surface area on the transceiver board 122 to be used by three components. The shield 128 is shown as somewhat bigger than the chip 142 to shield external RF components of the chip 142 not illustrated in FIG. 5, but it can have other dimensions, it can have about the same footprint area. A footprint for the shield and antenna combination might be in the range of 5 cm by 3 cm, 7 cm by 4 cm or the like.

One embodiment of overlaying the lid 130 and the shield 128 is illustrated in FIG. 5. The flaps 175 of the shield 128 include holes 172, while the tabs 140 of the lid 130 include dimples 173 to engage the holes 172 in the shield 128. The dimples 173 may be pressed into the lid 130 before, after, or at the time the lid 130 is stamped, as discussed above in conjunction with FIG. 3A. When the lid 130 is arranged to abut the shield 128, the dimples 173 in the lid 130 engage the holes 172 in the shield 128 to secure the lid 130 to the shield 128.

The chip 142 cooperates with the RF antenna arrangement 132 to support wireless data communication functions of the set-top box 100. A user can therefore use their wireless remote control, cell phone, a home computer Wi-Fi, or other device to communicate directly with the set-top box. The shield 128 protects radio chips on the printed circuit board 126 from unrelated frequencies that might interfere with the chips. In one embodiment as shown in FIG. 5, the shield 128 allows the chip 142 to function as an antenna efficiently by shielding from noise and other unrelated many frequencies.

Figure 6A:
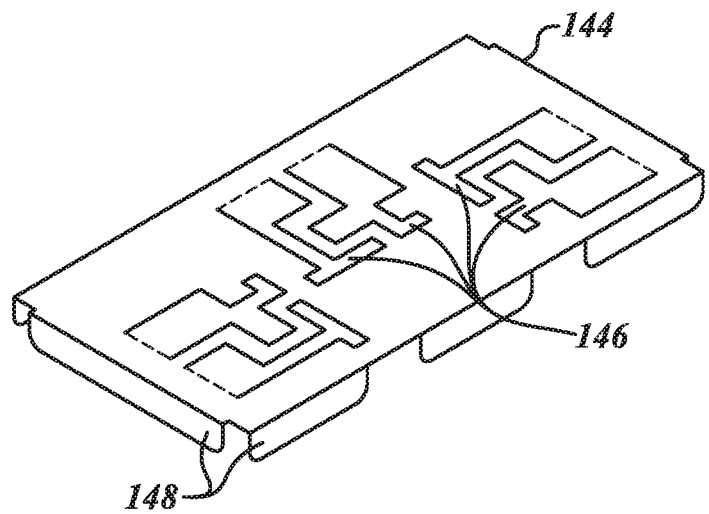
FIGS. 6A-6B are isometric views of processes of forming an RF antenna assembly according to another embodiment of the present disclosure.
Figure 6B:
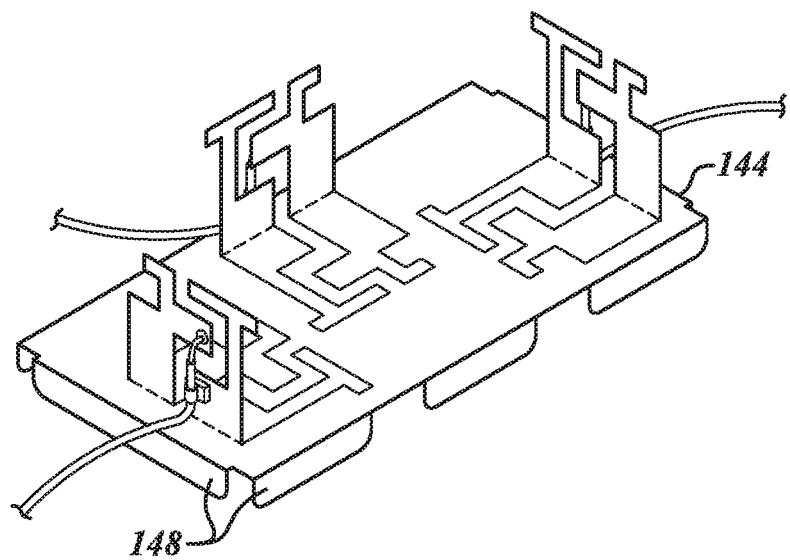

In FIGS. 6A and 6B, a lid 144 is shown as another embodiment of the present disclosure. In this embodiment, the lid 144 includes a plurality of RF antenna arrangements. The lid 144 is stamped out to form RF antenna arrangements 146 of the vertical double L type 5 GHz dipole antennas and tab sections 148, as shown in FIG. 6A. The RF antenna arrangements 146 extend from the surface of the lid 144, as shown in FIG. 6B. The RF antenna arrangements 146 and the tab sections 148 can be bent vertically from the surface of the lid along with the dotted line as shown in FIG. 6B. Each of RF transmission cables 150 is soldered to one of the RF antenna arrangements 146. The signal terminal of the cable 150 is soldered to the antenna lead pickup "feed" of each antenna arrangements 146 and the ground braid of cable 150 is soldered to the grounded surface element of antenna arrangements 146. The other end of cable 150 connects one of the RF antenna arrangements 146 to the appropriate radio chip, (not shown in FIG. 6B). The middle RF antenna arrangement 146 is rotated 90 degrees (orthogonal to the side antennas) as shown in FIG. 6B for isolation between the antennas. A number of features, functions, and characteristics of the lid 144 and the RF antenna arrangement 146 are similar or identical to those described above with reference to FIGS. 1-5. For the sake of brevity and clarity, such common subject matter will not be redundantly described here in the context of FIGS. 6A-6B.

Figure 7:
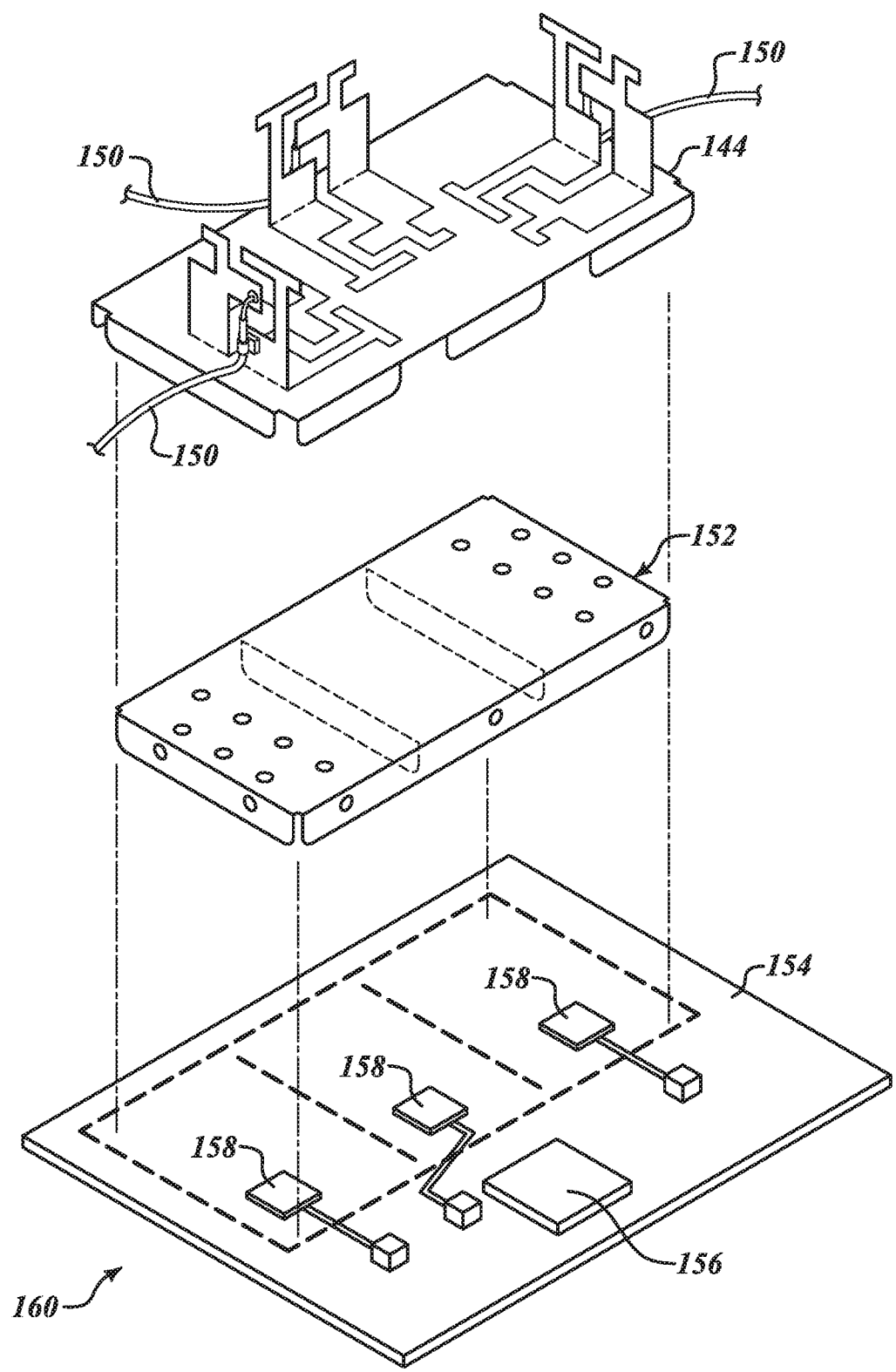
FIG. 7 is an exploded view of an antenna assembly on the transceiver board according to one embodiment of the present disclosure.

In FIG. 7, an exploded view of a transceiver board 160 is shown as another embodiment of the present disclosure. A plurality of RF chips 158, such as Wi-Fi chips, and a digital processor 156 are mounted on the printed circuit board 154. The radio frequency shield 152 is mounted on the printed circuit board 154 and above the chips 158. This shield 152 is an embodiment of shield 128 and has many of the same features and characteristics. In some other embodiments, the shield 152 is of a type that has additional apertures, not illustrated, that permit a great airflow for cooling of the plurality of chips. The lid 144 is positioned directly on the radio frequency shield 152, such that shield 152 has slightly smaller footprint than lid 144. The digital processor 156 cooperates with a plurality of the chips 158 and the RF antenna arrangement 146 to support wireless data communication functions of the set-top box 100. In this embodiment, the transceiver board 160 is configured to handle a plurality of frequencies with a plurality of the antenna arrangement 146 at the same time. A number of features, functions, and characteristics of the transceiver board 160, the shield 152 and the RF antenna arrangement 146 are similar or identical to those described above with reference to FIGS. 1-5. For the sake of brevity and clarity, such common subject matter will not be redundantly described here in the context of FIG. 7.

Figure 8:
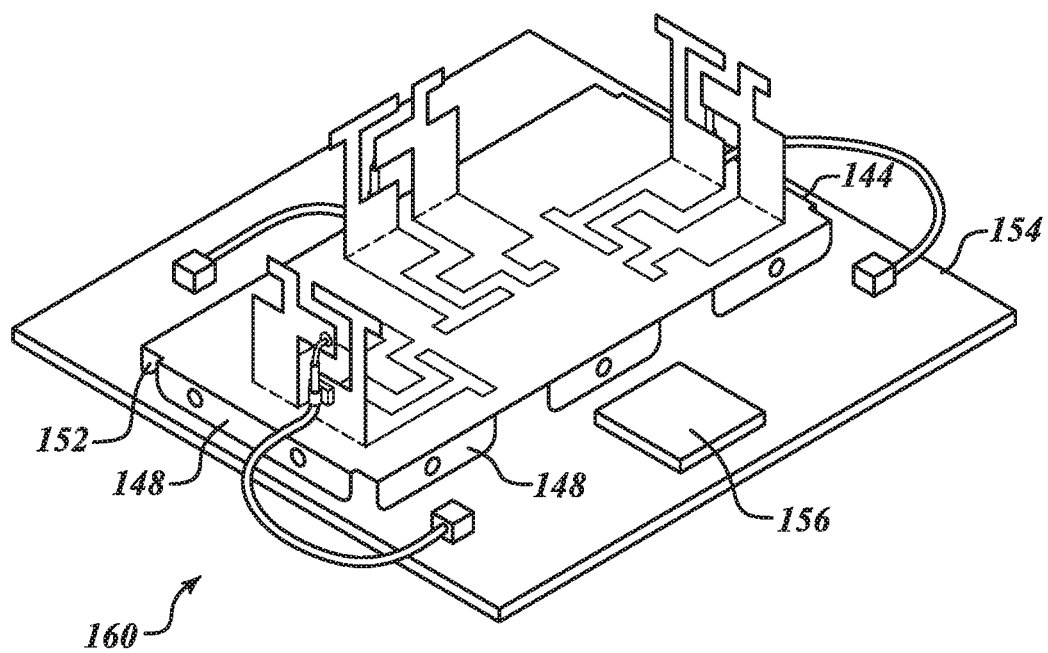
FIG. 8 is an isometric view of a transceiver board according to another embodiment of the present disclosure.

In FIG. 8, the transceiver board 160 is shown as another embodiment of the present disclosure. The transceiver board 160 comprises the printed circuit board 154, the digital processor 156, the radio frequency shield 152 and the lid 144. The lid 144 includes the tab sections 148 and the RF antenna arrangements 146. Each of RF transmission cables 150 is soldered to one of the RF antenna arrangements 146 and the surface of the lid 144 and connects one of the RF antenna arrangements 146 and the surface of the lid 144 to a RF connector (not shown in FIG. 8). A number of features, functions, and characteristics of the lid 144 and the RF antenna arrangement 146 are similar or identical to those described above with reference to FIGS. 1-5. For the sake of brevity and clarity, such common subject matter will not be redundantly described here in the context of FIG. 8.

The various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus comprising:
   a printed circuit board having a first surface;
   an integrated chip mounted on the first surface and including radio frequency (RF) communication circuitry;
   an RF shield coupled to the first surface, the RF shield directly overlying and encasing the integrated chip;
   a lid attached to and directly overlying the RF shield, the lid including a second surface and a first RF antenna on the second surface, the lid having a footprint that is greater than or equal to a footprint of the RF shield on the first surface;
   an RF transmission coaxial cable having an end portion physically and electrically connected to the first RF antenna; and
   wherein the RF shield includes two or more first flaps coupled to the first surface, and the lid includes two or more second flaps engaged with the two or more first flaps and securely connecting the lid to the RF shield.

2. The apparatus of claim 1, wherein the first RF antenna includes:
   a first section extending upwardly from the second surface, and
   a second section coupled to the first section and spaced apart from the second surface, the end portion of the RF transmission coaxial cable directly coupled to at least one of the first section and the second section.

3. The apparatus of claim 2, wherein the second section includes a first RF antenna element sized and shaped for communication at a first RF frequency and includes a second RF antenna element sized and shaped for communication at a second RF frequency different than the first RF frequency.

4. The apparatus of claim 2, wherein the end portion includes a first terminal directly coupled to the first section and a second terminal directly coupled to the second section.

5. The apparatus of claim 1, wherein the lid includes a flat sheet and the first RF antenna is stamped out from the flat sheet in an antenna shape.

6. The apparatus of claim 1, wherein the RF shield or the lid is directly coupled to a ground of the printed circuit board on the first surface.

7. The apparatus of claim 1, wherein two or more surfaces of the lid are in direct contact with two or more surfaces of the RF shield.

8. The apparatus of claim 1, further comprising:
   a second RF antenna extending from the second surface and spaced apart from the first RF antenna on the second surface.

9. An apparatus, comprising:
   a printed circuit board having a surface;
   an integrated chip mounted on the surface, the integrated chip including radio frequency (RF) communication circuitry;
   an RF shield directly coupled to the printed circuit board and encasing the integrated chip;
   a lid coupled to the RF shield and including an upper portion and a first RF antenna with a first section and a second section, the first section including one or more RF receiving elements and the second section extending from the upper portion;
   an RF transmission coaxial cable having an end portion physically and electrically connected to the first RF antenna; and
   wherein the lid includes a second RF antenna having a third section with one or more RF receiving elements and a fourth section extending from the upper portion of the lid.

10. The apparatus of claim 9, wherein the lid includes a first side portion extending downwardly from a first side of the upper portion and a second side portion extending downwardly from a second side of the upper portion opposite to the first side, the first side portion and the second side portion engaged with the RF shield.

11. The apparatus of claim 9, the lid having a footprint that is greater than or equal to a footprint of the RF shield on the surface, and the footprint of the lid being smaller than or equal to an area of the surface.

* * * * *